(12) United States Patent
Oga et al.

(10) Patent No.: US 9,117,688 B2
(45) Date of Patent: Aug. 25, 2015

(54) SEMICONDUCTOR DEVICE, INVERTER DEVICE PROVIDED WITH SEMICONDUCTOR DEVICE, AND IN-VEHICLE ROTATING ELECTRICAL MACHINE PROVIDED WITH SEMICONDUCTOR DEVICE AND INVERTER DEVICE

(75) Inventors: Takuya Oga, Chiyoda-ku (JP); Masaki Kato, Chiyoda-ku (JP); Tsuyoshi Sugihara, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 14 days.

(21) Appl. No.: 13/985,780

(22) PCT Filed: Apr. 18, 2011

(86) PCT No.: PCT/JP2011/002253
§ 371 (c)(1),
(2), (4) Date: Aug. 15, 2013

(87) PCT Pub. No.: WO2012/143964
PCT Pub. Date: Oct. 26, 2012

(65) Prior Publication Data
US 2013/0320818 A1 Dec. 5, 2013

(51) Int. Cl.
*H01L 23/48* (2006.01)
*H01L 23/495* (2006.01)
(Continued)

(52) U.S. Cl.
CPC ............ *H01L 25/07* (2013.01); *B60L 11/1803* (2013.01); *B60L 15/007* (2013.01);
(Continued)

(58) Field of Classification Search
CPC ................................. H01L 25/07; H01L 24/73
USPC .......................... 257/777; 310/68 D; 363/131
See application file for complete search history.

(56) References Cited

U.S. PATENT DOCUMENTS 6,618,278 B2 * 9/2003 Suzuki et al. ................. 363/144
2005/0121777 A1 6/2005 Hata et al.
(Continued)

FOREIGN PATENT DOCUMENTS

JP 08-148623 A 6/1996
JP 2002-217364 A 8/2002
(Continued)

OTHER PUBLICATIONS
ST Automotive fully integrated H-bridge motor driver Sep. 2010 pp. 1-34.*
(Continued)

*Primary Examiner* — Julio J Maldonado
*Assistant Examiner* — Moazzam Hossain
(74) *Attorney, Agent, or Firm* — Sughrue Mion, PLLC; Richard C. Turner

(57) ABSTRACT

Provided is a semiconductor device including: a first MOS-FET (21) joined to a first base plate (11) via solder (61); a second MOS-FET (22) joined to a second base plate (12) via solder (64); a first lead (31) joining the first base plate (11) and the second MOS-FET (22); and a second lead (32) joining the second MOS-FET (22) and a current path member (13) that gives and receives current flowing through the MOS-FETs (21, 22) to and from the outside. The second base plate (12) is more rigid than both the leads (31, 32), a boundary line (D-D) intersects the second base plate (12) without intersecting both the leads (31, 32), the boundary line including a gap portion (52) along which both the MOS-FETs (21, 22) are opposed to each other, extending in the direction in which both the MOS-FETs (21, 22) are not opposed to each other.

14 Claims, 12 Drawing Sheets

(51) Int. Cl.
*H01L 25/07* (2006.01)
*H01L 23/00* (2006.01)
*H01L 23/31* (2006.01)
*H02K 11/00* (2006.01)
*H02M 7/537* (2006.01)
*B60L 11/18* (2006.01)
*B60L 15/00* (2006.01)

(52) U.S. Cl.
CPC ...... *H01L23/3107* (2013.01); *H01L 23/49524* (2013.01); *H01L 23/49551* (2013.01); *H01L 23/49562* (2013.01); *H01L 23/49575* (2013.01); *H01L 24/40* (2013.01); *H01L 24/73* (2013.01); *H02K 11/0073* (2013.01); *H02M 7/537* (2013.01); *H01L 24/05* (2013.01); *H01L 24/06* (2013.01); *H01L 24/29* (2013.01); *H01L 24/32* (2013.01); *H01L 24/33* (2013.01); *H01L 24/37* (2013.01); *H01L 24/45* (2013.01); *H01L 24/48* (2013.01); *H01L 2224/04026* (2013.01); *H01L 2224/04034* (2013.01); *H01L 2224/04042* (2013.01); *H01L 2224/05553* (2013.01); *H01L 2224/05567* (2013.01); *H01L 2224/05571* (2013.01); *H01L 2224/0603* (2013.01); *H01L 2224/06181* (2013.01); *H01L 2224/291* (2013.01); *H01L 2224/32245* (2013.01); *H01L 2224/33181* (2013.01); *H01L 2224/3701* (2013.01); *H01L 2224/37147* (2013.01); *H01L 2224/40137* (2013.01); *H01L 2224/40247* (2013.01); *H01L 2224/40249* (2013.01); *H01L 2224/45124* (2013.01); *H01L 2224/48091* (2013.01); *H01L 2224/48247* (2013.01); *H01L 2224/48465* (2013.01); *H01L 2224/48699* (2013.01); *H01L 2224/73215* (2013.01); *H01L 2224/73221* (2013.01); *H01L 2224/73263* (2013.01); *H01L 2224/73265* (2013.01); *H01L 2924/00014* (2013.01); *H01L 2924/014* (2013.01); *H01L 2924/01013* (2013.01); *H01L 2924/01029* (2013.01); *H01L 2924/01082* (2013.01); *H01L 2924/1306* (2013.01); *H01L 2924/13055* (2013.01); *H01L 2924/13091* (2013.01); *H01L 2924/1815* (2013.01); *H01L 2924/3511* (2013.01); *Y02T 10/7005* (2013.01)

(56) References Cited

U.S. PATENT DOCUMENTS

| | | |
|---|---|---|
| 2007/0108600 A1 | 5/2007 | Hata et al. |
| 2008/0136265 A1* | 6/2008 | Mizukoshi et al. ............ 307/89 |
| 2008/0211010 A1 | 9/2008 | Hata et al. |
| 2010/0289127 A1* | 11/2010 | Kanazawa et al. ............ 257/666 |
| 2011/0068450 A1* | 3/2011 | Takahashi ..................... 257/676 |

FOREIGN PATENT DOCUMENTS

| | | |
|---|---|---|
| JP | 2004-297847 A | 10/2004 |
| JP | 2005-167013 A | 6/2005 |
| JP | 4102012 B2 | 6/2008 |
| JP | 4349364 B2 | 10/2009 |
| JP | 2010-267789 A | 11/2010 |

OTHER PUBLICATIONS

JP 2004-297847 A English Translation.*
Japanese Office Action (Preliminary Notice of Reasons for Rejection) dated Jun. 24, 2014, Application No. 2013-510731.
Japanese Office Action dated Feb. 9, 2015 in Japanese Application No. 2013-510731.

* cited by examiner

SEMICONDUCTOR DEVICE, INVERTER
DEVICE PROVIDED WITH
SEMICONDUCTOR DEVICE, AND
IN-VEHICLE ROTATING ELECTRICAL
MACHINE PROVIDED WITH
SEMICONDUCTOR DEVICE AND INVERTER
DEVICE

CROSS REFERENCE TO RELATED APPLICATIONS

This application is a National Stage of International Application No. PCT/JP2011/002253 filed Apr. 18, 2011, the contents of all of which are incorporated herein by reference in their entirety.

TECHNICAL FIELD

The present invention relates to a semiconductor device sealed in a sealing material, an inverter device including the semiconductor device, and a rotating electrical machine for a vehicle including the semiconductor device and the inverter device.

BACKGROUND ART

In recent years, as the performance of a semiconductor device becomes higher, a semiconductor device is in increasing demand particularly in in-vehicle equipment or in a rotating electrical machine for a vehicle. In in-vehicle equipment, the respective components are in the process of downsizing. In a rotating electrical machine for a vehicle, as wiring is simplified and mountability is improved by integrating a rotating electrical machine main body and a controller, downsizing and weight reduction of semiconductor devices used therein are required accordingly. In particular, a use environment of in-vehicle equipment or the like is harsh, and thus, additionally, high reliability and a long life are further required.

Conventionally, some MOS-FETs mounted on a semiconductor device are connected in series in a pair so as to form an upper arm and a lower arm, respectively. A semiconductor device has been proposed having a structure in which, a source electrode or a gate electrode of each MOS-FET and an external terminal are joined using an internal lead via solder, a coupling lead portion is provided in the internal lead joined to the source electrode of the MOS-FET which forms the upper arm so that the upper arm and the lower arm are electrically connected to each other, and the coupling lead portion is solder joined to part of a base plate on which the MOS-FET forming the lower arm is mounted and with which a drain electrode is brought into abutment.

CITATION LIST

Patent Literature

[PTL 1]: JP 4102012 B (FIG. 7)
[PTL 2]: JP 4349364 B (FIG. 1)

SUMMARY OF INVENTION

Technical Problem

In the structures disclosed in Patent Literatures 1 and 2, the MOS-FETs forming the upper arm and the lower arm, respectively, are adjacent to and opposed to each other so as to have a gap portion therebetween. The above-mentioned coupling lead portion is provided so as to intersect the gap portion between the MOS-FETs forming the upper and lower arms. In the structure disclosed in Patent Literature 2, the MOS-FETs forming the upper and lower arms and the above-mentioned coupling lead portion are packaged using a sealing resin.

When temperature rise is caused during the operation of the semiconductor device having such a structure, due to difference in thermal expansion coefficient between a base plate formed of, for example, copper, on which each MOS-FET is mounted and, for example, an epoxy resin which is used as the sealing resin, the semiconductor device is liable to be deformed so as to be V-shaped as a whole seen from a side. With regard to the deformation, deformation with the gap portion along which the MOS-FETs are adjacent to each other being a boundary line of bending is the largest, because the influence of heat generation by the above-mentioned MOS-FETs on the deformation is great. When the coupling lead portion is located on the boundary line, external force is applied also to the coupling lead portion, which causes the coupling lead portion to be easily deformed. The deformation of the coupling lead portion repeatedly applies stress to the solder joined to the coupling lead portion, which may cause a crack in the solder leading to inconvenience such as breakage of the semiconductor device.

In this case, by increasing the rigidity through, for example, increasing the plate thickness of the above-mentioned coupling lead, adding another member, or the like, the deformation can be reduced to inhibit a crack in the solder. However, the cost and the weight of the coupling lead increase. Further, by increasing the plate thickness, the amount of usage of the sealing resin increases and the size of the semiconductor device in a height direction increases, and thus, there are concerns that the size and the weight of the semiconductor device may increase. Further, it is also thought to alleviate stress applied to the solder by providing a bent portion in the coupling lead to absorb the stress by the portion, but there is a limit thereto, and in addition, processing costs increase.

The present invention has been made to solve the above-mentioned problem, and an object of the present invention is to provide a semiconductor device which can inhibit occurrence of a crack in a joining material resulting from deformation during the operation of the semiconductor device and which can improve the reliability and the life of the semiconductor device, an inverter device including the semiconductor device, and a rotating electrical machine for a vehicle including the semiconductor device and the inverter device.

Solution to Problem

According to the present invention, there is provided a semiconductor device, including: a first base plate including a conductor; a first semiconductor element having a first electrode surface that is electrically joined onto the first base plate via a joining material; a second base plate including a conductor, the second base plate being away from the first base plate; a second semiconductor element that is adjacent to the first semiconductor element and has a first electrode surface that is electrically joined onto the second base plate via a joining material; a first lead for electrically joining a second electrode surface of the first semiconductor element and the second base plate via a joining material; a current path member for giving and receiving current flowing through both the first semiconductor element and the second semiconductor element to and from outside, the current path member being away from both the first base plate and the second base plate; a second lead for electrically joining a second electrode surface of the second semiconductor element and the current path member via a joining material; and a sealing material for sealing at least the respective structural members, in which: a rigidity of the second base plate is higher than a rigidity of the first lead and a rigidity of the second lead; and a boundary line including a gap portion along which the first semiconductor element and the second semiconductor element are opposed to each other and extending in a direction in which both the first semiconductor element and the second semiconductor element are not opposed to each other intersects the second base plate without intersecting the first lead and the second lead.

Advantageous Effects of Invention

According to the present invention, the second base plate having a rigidity higher than those of the leads intersects the boundary line between the semiconductor elements on which the deformation is the largest. The deformation on the boundary line of the second base plate is smaller than that of the leads, and thus, stress on the joining materials joined to the second base plate can be alleviated. On the other hand, the leads can be located at locations at which the deformation is smaller, and thus, stress on the joining materials joined to the leads can be alleviated. As a result, the semiconductor device which can inhibit occurrence of a crack in a joining material and which can improve the reliability and the life of the semiconductor device, the inverter device including the semiconductor device, and the rotating electrical machine for a vehicle including the semiconductor device and the inverter device can be provided.

DESCRIPTION OF EMBODIMENTS

First Embodiment

Figure 1:
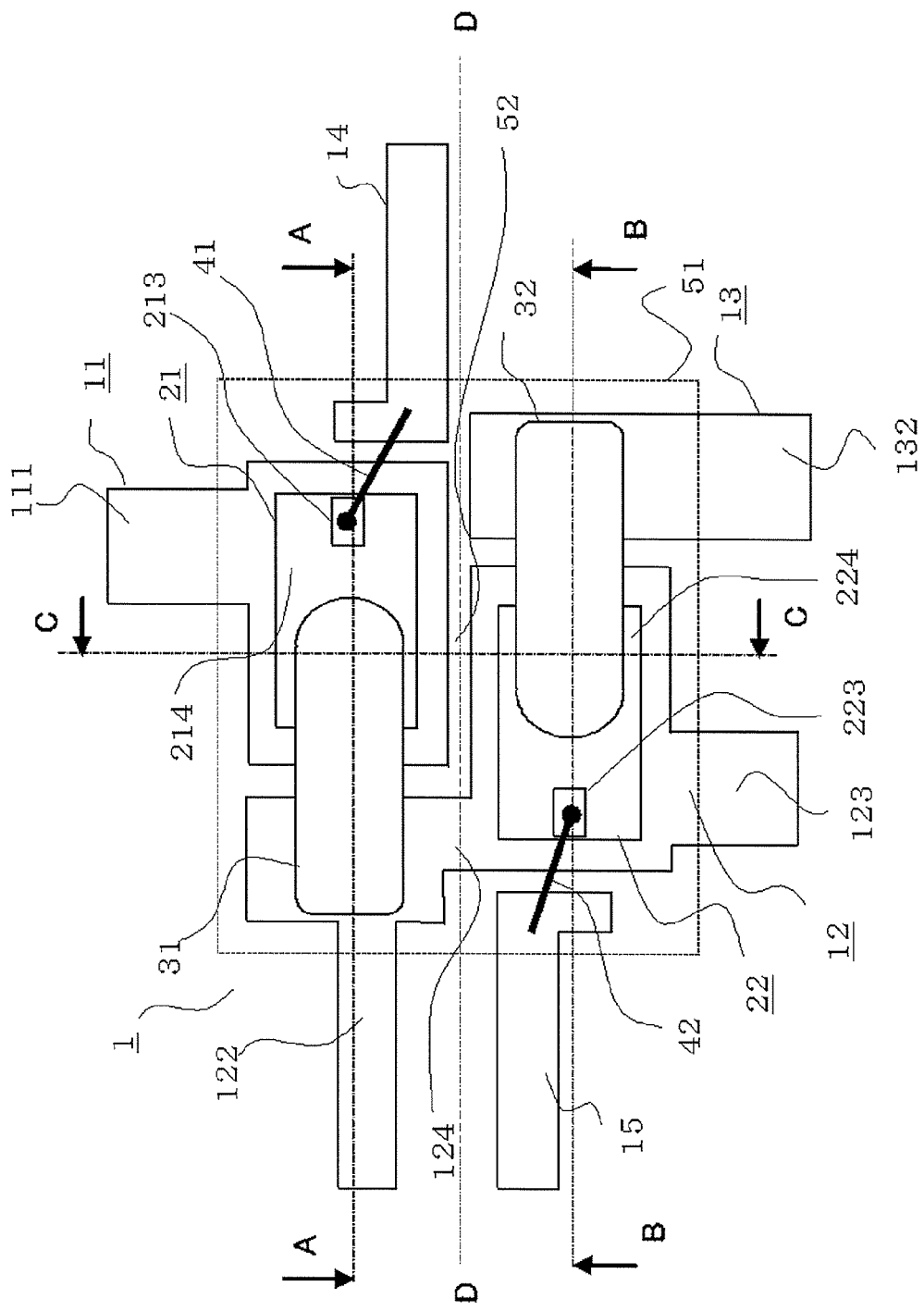
FIG. 1 A plan view illustrating a semiconductor device according to a first embodiment of the present invention.
Figure 2:
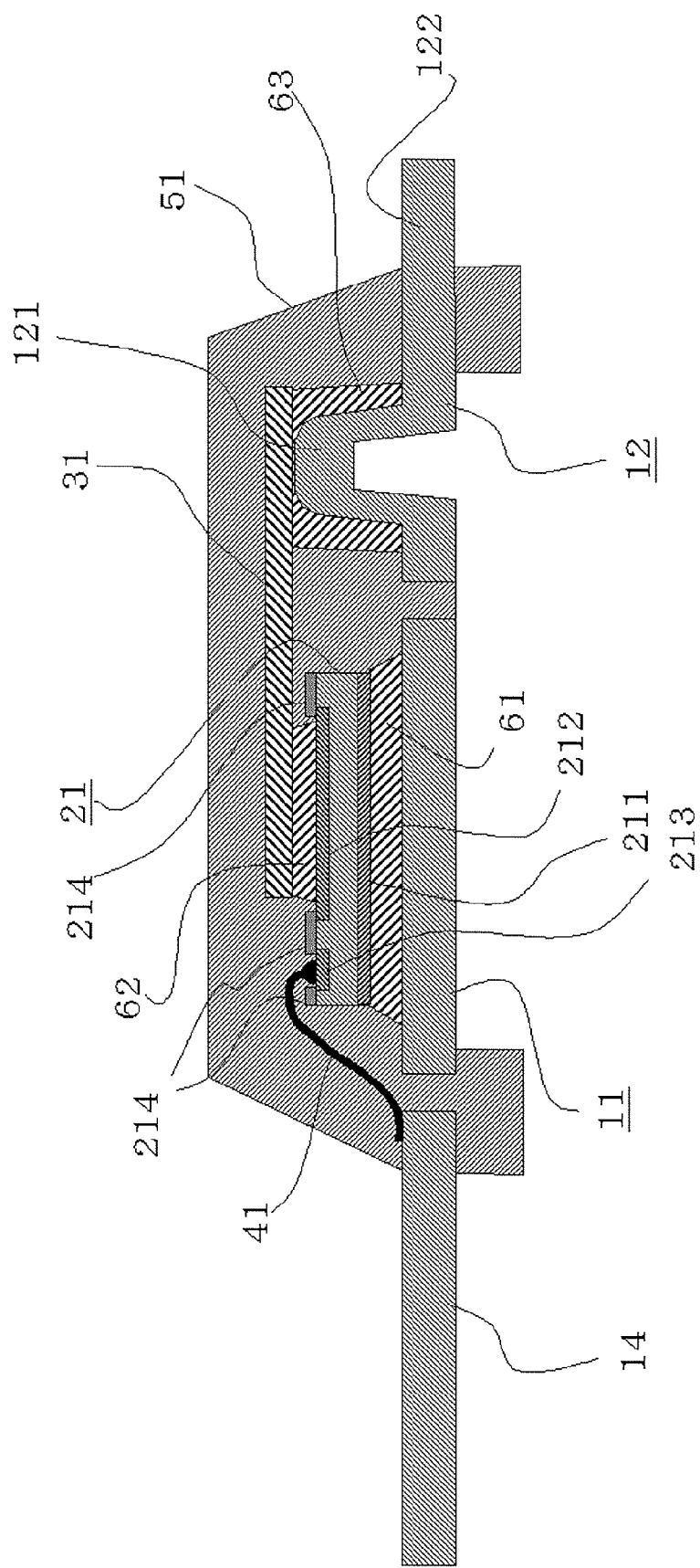
FIG. 2 A sectional view of the semiconductor device seen from a direction of arrows A-A of FIG. 1.
Figure 3:
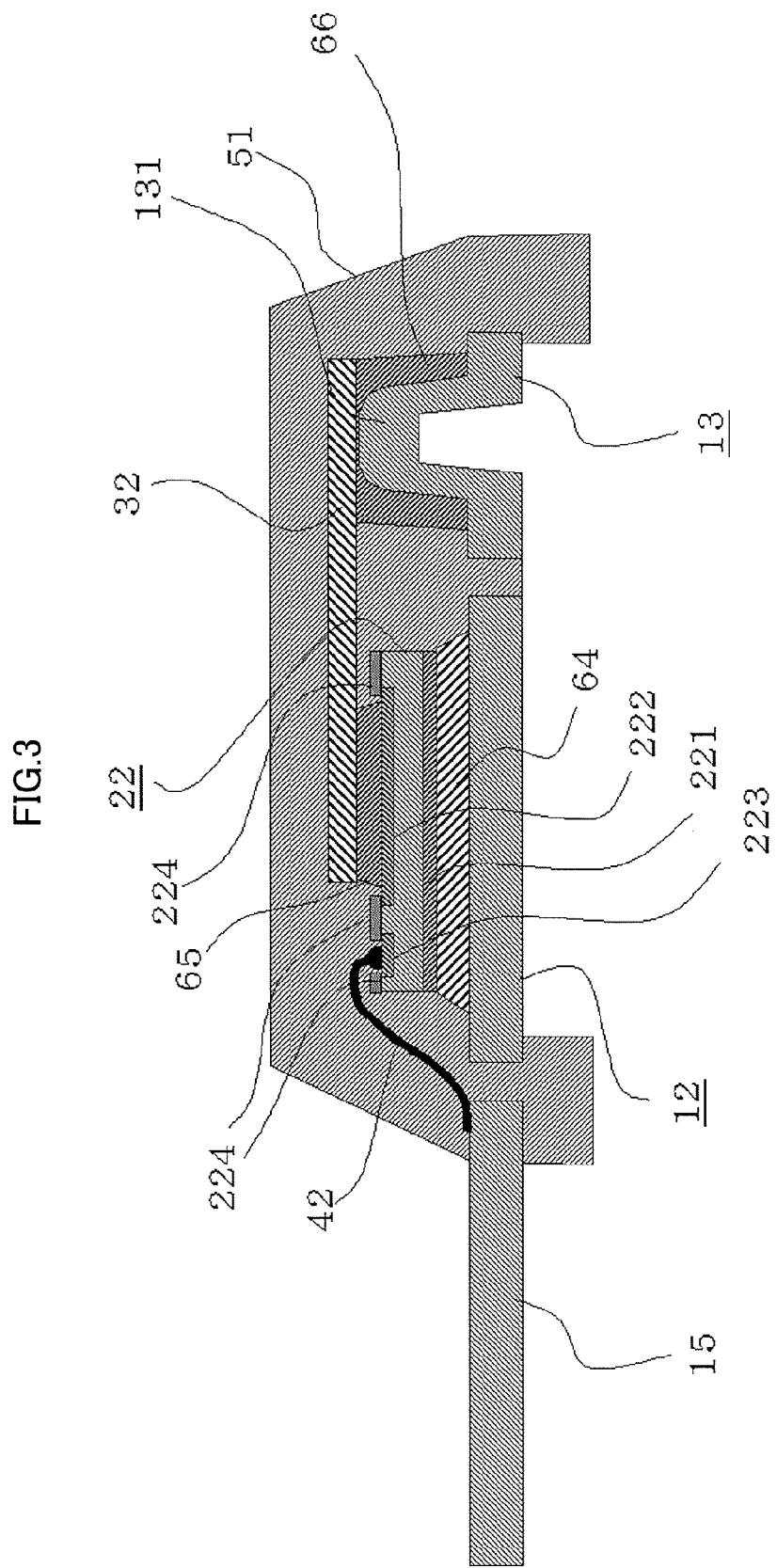
FIG. 3 A sectional view of the semiconductor device seen from a direction of arrows B-B of FIG. 1.
Figure 4:
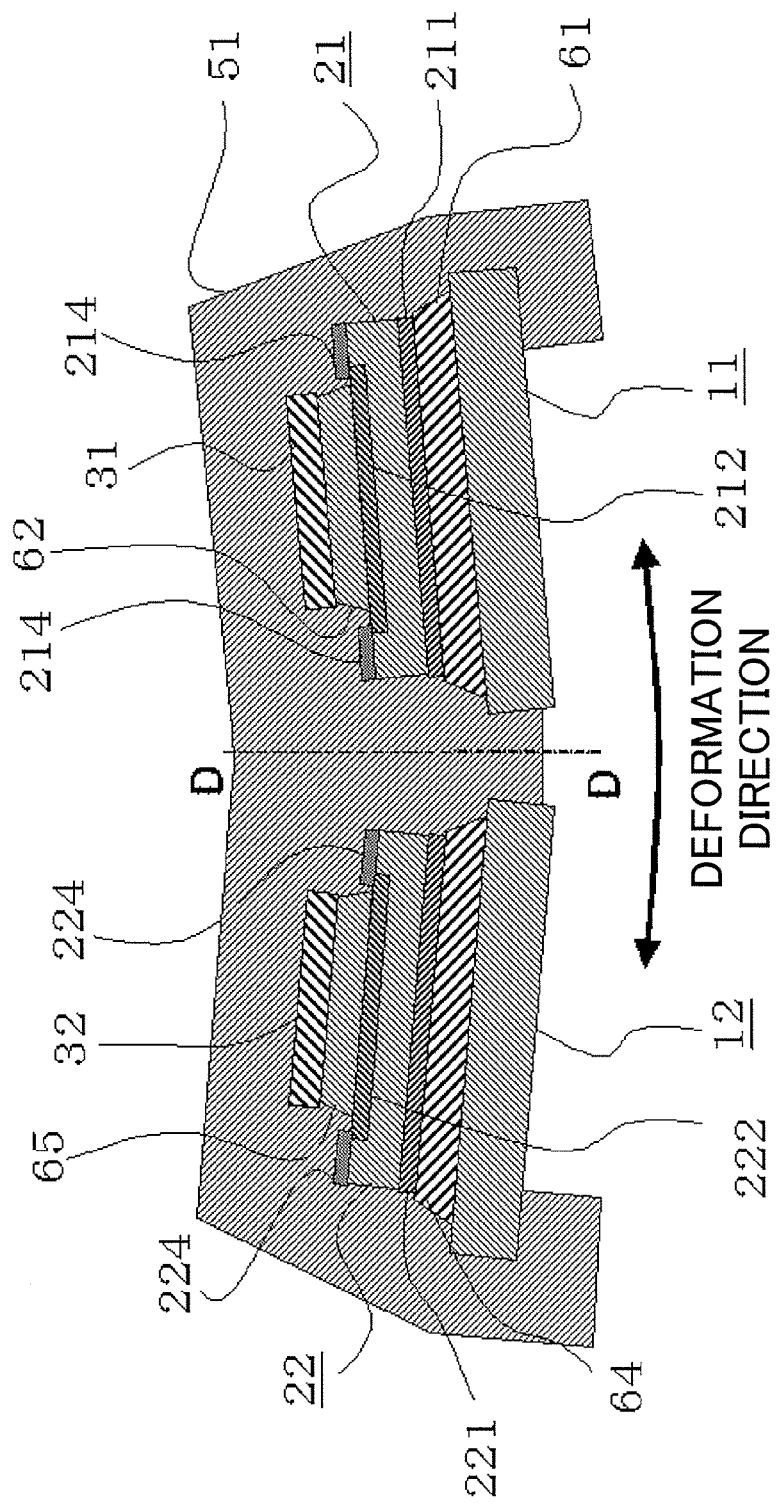
FIG. 4 A sectional view of the semiconductor device when deformed seen from a direction of arrows C-C of FIG. 1.
Figure 8:
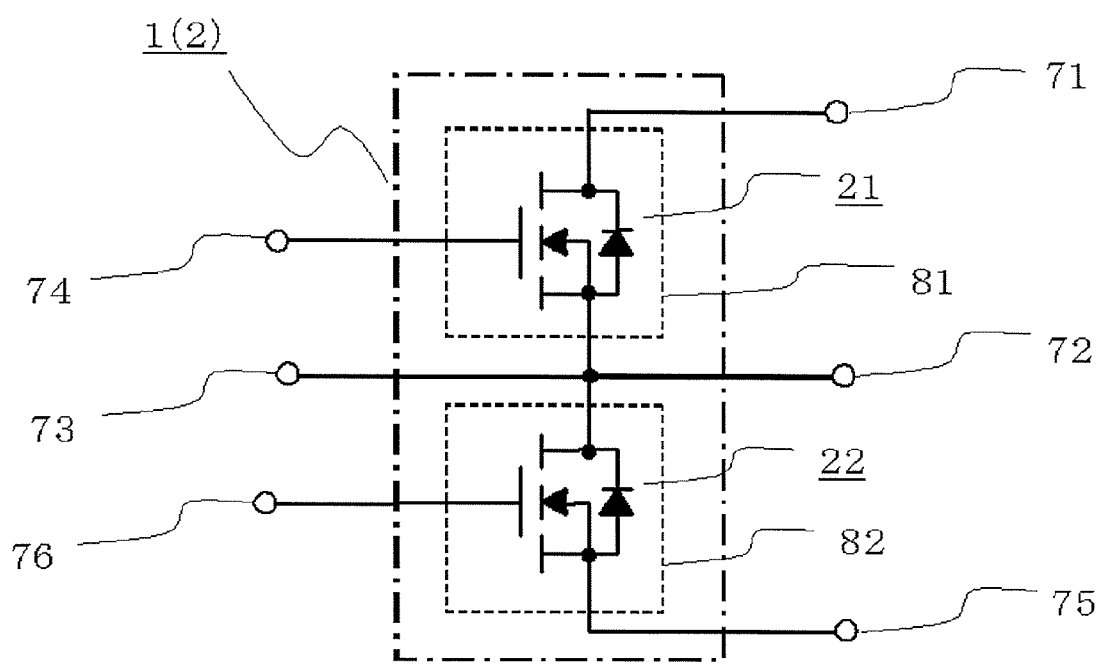
FIG. 8 An electrical circuit diagram of the semiconductor device according to Embodiments 1 and 2 of the present invention.

FIG. 1 is a plan view illustrating a semiconductor device according to a first embodiment of the present invention. FIG. 2 is a sectional view of the semiconductor device seen from a direction of arrows A-A of FIG. 1. FIG. 3 is a sectional view of the semiconductor device seen from a direction of arrows B-B of FIG. 1. FIG. 4 is a sectional view of the semiconductor device when deformed seen from a direction of arrows C-C of FIG. 1. FIG. 8 is an electrical circuit diagram of the semiconductor device illustrated in FIG. 1. In the following description, like reference numerals are used to designate like or corresponding parts throughout the figures. Note that, in plan views, a sealing resin is simplified for the sake of convenience.

In FIG. 1, a semiconductor device 1 includes first and second base plates 11 and 12, a current path member 13, first and second MOS-FETs 21 and 22 which are semiconductor elements, first and second leads 31 and 32, aluminum wires 41 and 42, and leads 14 and 15 for gate electrodes. The above-mentioned components are packaged using a sealing resin 51 which is a sealing material.

As illustrated in FIG. 1 and FIG. 2, the first MOS-FET 21 is located on an upper surface of the first base plate 11, and a drain electrode 211 formed on a lower surface of the first MOS-FET 21 is electrically joined to an upper surface of the first base plate 11 via solder which is a joining material 61. The first base plate 11 includes an area in which the first MOS-FET 21 is located and a positive electrode terminal joining portion 111 to be electrically joined to a positive electrode terminal 71 (not shown). The first MOS-FET 21 has on its upper surface a source electrode 212 and a gate electrode 213. Except for locations at which the source electrode 212 and the gate electrode 213 are formed, the upper surface of the first MOS-FET 21 is protected by a protective film 214 formed in a wafer process.

One end of the first lead 31 which is formed of a plate-like metal is electrically joined to the source electrode 212 located on the upper surface of the first MOS-FET 21 via solder which is a joining material 62. The other end of the first lead 31 is electrically joined to the second base plate 12 via solder which is a joining material 63. In this case, a protruding portion 121 is provided in part of the second base plate 12 so as to be in proximity to the first lead 31, and the second base plate 12 is electrically joined to the first lead 31 at this location. Further, the second base plate 12 includes a control terminal joining portion 122 located at one end thereof, an output terminal joining portion 123 located at another end thereof, which is to be electrically joined to an output terminal 72 (not shown), and an area therebetween in which the second MOS-FET 22 is located. A control terminal 73 (not shown) for inputting a source signal is connected to the control terminal joining portion 122.

Further, the gate electrode 213 of the first MOS-FET 21 is electrically joined to the lead 14 for the gate electrode via the aluminum wire 41. The lead 14 for the gate electrode is connected to the control terminal 74 (not shown) for inputting a gate signal.

Next, as illustrated in FIG. 3, the second MOS-FET 22 is located on an upper surface of the second base plate 12, and a drain electrode 221 formed on a lower surface of the second MOS-FET 22 is electrically joined to the upper surface of the second base plate 12 via solder which is a joining material 64. Similarly to the first MOS-FET 21, the second MOS-FET 22 has on its upper surface a source electrode 222 and a gate electrode 223. Except for locations at which the source electrode 222 and the gate electrode 223 are formed, the upper surface of the second MOS-FET 22 is protected by a protective film 224 formed in a wafer process. One end of the second lead 32 which is formed of a plate-like metal is electrically joined to the source electrode 222 located on the upper surface of the second MOS-FET 22 via solder which is a joining material 65. The other end of the second lead 32 is electrically joined to the current path member 13 via solder which is a joining material 66. In this case, similarly to the case of the second base plate 12, a protruding portion 131 is provided in part of the current path member 13 so as to be in proximity to the second lead 32, and the current path member 13 is electrically joined to the second lead 32 at this location. The current path member 13 includes a negative electrode terminal joining portion 132 (not shown) to be electrically joined to a negative electrode terminal 75 (not shown).

Further, similarly to the case of the first MOS-FET 21, the gate electrode 223 of the second MOS-FET 22 is electrically joined to the lead 15 for the gate electrode via the aluminum wire 42. The lead 15 for the gate electrode is connected to a control terminal 76 (not shown) for inputting a gate signal.

The MOS-FETs 21 and 22 are located on the upper surfaces of the first and second base plates 11 and 12, respectively, and thus, it is necessary to inhibit warpage of the first and second base plates 11 and 12. Therefore, the first and second base plates 11 and 12 have rigidities to some extent (for example, a copper plate or a copper alloy plate having a thickness of 0.8 mm). On the other hand, the necessary widths and thicknesses of the first and second leads 31 and 32 depend on current which flows through the MOS-FETs 21 and 22. Generally, the rigidities of the first and second leads 31 and 32 can be lower than those of the first and second base plates 11 and 12 (for example, a copper plate or a copper alloy plate having a thickness of 0.4 mm).

In this case, as illustrated in FIG. 1, the first and second MOS-FETs 21 and 22 are located so as to be adjacent to each other with a gap portion 52 therebetween under a state in which a longitudinal side of four sides forming the MOS-FET 21 and a longitudinal side of four sides forming the MOS-FET 22 are opposed to each other. The MOS-FETs 21 and 22 are located so as to be point symmetric with respect to the gap portion. When a line which includes the gap portion 52 and extends in parallel with the longitudinal sides of the MOS-FETs 21 and 22 is defined as a boundary line D-D, the direction in which the first lead 31 solder joined to the source electrode 212 of the first MOS-FET 21 extends and the direction in which the second lead 32 solder joined to the source electrode 222 of the second MOS-FET 22 extends are opposite to each other and are in parallel with the boundary line D-D.

Further, the second base plate 12 has a stress absorbing portion 124 provided between an area thereof which is solder joined to the first lead 31 and an area thereof which is solder joined to the second MOS-FET 22. The second lead 12 and the boundary line D-D intersect each other in this portion. The rigidity of the stress absorbing portion 124 in the direction of deformation with the boundary line D-D being the bend line is reduced by causing the width thereof in parallel with the boundary line D-D to be smaller compared with those of other portions in the second lead 12.

Further, as illustrated in FIG. 1, FIG. 2, and FIG. 3, the sealing resin 51 for protection against an external environment seals, using a transfer mold or the like, the first and second MOS-FETs 21 and 22, the solder 61 to 66, the first and second leads 31 and 32, the aluminum wires 41 and 42, and the leads 14 and 15 for the gate electrodes so that the positive electrode terminal joining portion 111 of the first base plate 11, the control terminal joining portion 122 and the output terminal joining portion 123 of the second base plate 12, the negative electrode terminal joining portion 132 of the current path member 13, and part of the leads 14 and 15 for the gate electrodes are exposed. As a result, a quadrangular package seen from above as illustrated in FIG. 1 is formed. Further, a lower surface side of the first base plate 11 at a location to which the first MOS-FET 21 is joined, a lower surface side of the second base plate 12 at a location to which the second MOS-FET 22 is joined, and the like form heat dissipating surfaces, and thus, are configured to be exposed from the sealing resin 51.

FIG. 8 illustrates an electrical circuit diagram of the semiconductor device 1 configured as described above. The first MOS-FET 21 forms an upper arm 81 in the semiconductor device 1, and the second MOS-FET 22 forms a lower arm 82.

In this case, when the temperature of the entire semiconductor device 1 including the MOS-FETs 21 and 22 and the first and second leads 11 and 12 rises during the operation of the semiconductor device 1, due to difference in thermal expansion coefficient between the first and second leads 11 and 12 made of a material such as copper or a copper alloy and the sealing resin 51 made of a material such as an epoxy resin, the entire shape of the semiconductor device 1 is liable to be deformed so as to be V-shaped toward the sealing resin 51 having a small thermal expansion coefficient as illustrated in FIG. 4. Deformation with the boundary line D-D along which the MOS-FETs 21 and 22 are adjacent to and opposed to each other being the bend line is the largest, because of the influence of heat generated by the MOS-FETs 21 and 22.

In this first embodiment, the boundary line D-D and the first and second leads 31 and 32 are located so as not to intersect each other and the boundary line D-D intersects the second base plate 12. Therefore, the first and second leads 31 and 32 can be away from the boundary line D-D which is to be the bent line in deformation, external force to be applied to the first and second leads 31 and 32 becomes smaller, and deformation of the first and second leads 31 and 32 is inhibited. Therefore, stress to be applied to the solder 62 and 63 joined to the first lead 31 can be alleviated. On the other hand, the second base plate 12 intersects the boundary line D-D. However, the rigidity of the second base plate 12 is higher than those of the first and second leads 31 and 32, and thus, deformation of the second plate 12 due to external force applied thereto can be inhibited compared with deformation of the first and second leads 31 and 32 due to external force applied to the first and second leads 31 and 32. Therefore, stress to be applied to the solder 63 and 64 joined to the second base plate 12 can be alleviated compared with stress to be applied to solder joining portions of the first and second leads 31 and 32. As a result, occurrence of a crack in the solder can be inhibited at any of the solder joining locations, and the reliability and the life of the semiconductor device 1 can be improved.

In addition, in this first embodiment, the second base plate 12 and the boundary line D-D intersect each other at a location other than the gap portion 52 along which the MOS-FETs 21 and 22 are adjacent to and opposed to each other. Even if the gap portion 52 is at the location at which the second base plate 12 and the boundary line D-D intersect each other, the rigidity of the second base plate 12 is higher than those of the first and second leads 31 and 32 as described above, and thus, the effects of inhibiting occurrence of a crack in the solder and improving the reliability and the life of the semiconductor device 1 can be obtained, but the above-mentioned gap portion 52 is at a location which is closest to the MOS-FETs 21 and 22 that generate a large amount of heat and thus large deformation occurs. Therefore, by setting the intersection at a location other than the gap portion, deformation of the semiconductor device 1 can be inhibited more, and thus, the effects become greater.

Further, in this first embodiment, the stress absorbing portion 124 is provided in the second base plate 12 at a location which intersects the boundary line D-D. The stress absorbing portion 124 absorbs stress when the semiconductor device 1 is deformed, and thus, stress applied to the second lead 12 at the solder joining portion with the first lead 31 and at the solder joining portion with the drain electrode 221 of the second MOS-FET 22 can be alleviated. Therefore, occurrence of a crack in the solder at these locations can be further inhibited, and the reliability and the life of the semiconductor device 1 can be further improved.

In this first embodiment, by reducing the width of the stress absorbing portion 124 in a direction in parallel with the boundary line D-D, the rigidity thereof is set to be lower than those in other portions of the second base plate 12, but the present invention is not limited thereto. Similar effects can also be obtained as follows. The rigidity of the stress absorbing portion 124 is set to be lower than those in other portions of the second base plate 12 by, for example, reducing the thickness by presswork or the like or providing a small width portion by a through hole, a recess, a notch, or the like. Alternatively, a bent portion which is bent in a direction of intersection with the boundary line D-D is provided.

In addition, conventionally, the first lead 31 for electrically joining the MOS-FETs 21 and 22 which form the upper and lower arms 81 and 82, respectively, is joined to the second base plate 12 so as to intersect the gap portion 52 which is on the boundary line D-D and along which the first and second MOS-FETs 21 and 22 are adjacent to each other, and thus, in order to secure the joined location, a predetermined clearance is necessary in the gap portion 52. However, in this first embodiment, the gap portion 52 does not need the joined location, and thus, the gap portion 52 can be reduced, and there is a possibility that the semiconductor device 1 as a whole can be downsized.

Further, in this first embodiment, the first and second MOS-FETs 21 and 22 of the same type are located so as to be point symmetric with respect to the gap portion 52, and further, the direction in which the first lead 31 extends from the joining portion with the first MOS-FET 21 and the direction in which the second lead 32 extends from the joining portion with the second MOS-FET 22 are in parallel with and opposite to each other. Such locating enables the length of the semiconductor device 1 in the direction in parallel with the boundary line D-D to be smaller than that in a case in which the first and second MOS-FETs 21 and 22 and the first and second leads 31 and 32 are located so as to be in parallel with each other in the same direction, and thus, space can be used efficiently and downsizing as a whole can be achieved. In addition, the amount of usage of the sealing resin 51 can be reduced, and thus, the weight and the cost are also reduced. Further, the downsizing can inhibit deformation of the semiconductor device 1, and thus, as a result, occurrence of a crack in the solder can be further inhibited, and the reliability and the life of the semiconductor device 1 can be further improved.

Note that, in this first embodiment, a case in which the first and second leads 31 and 32 are located so as to be in parallel with and opposite to each other is described, but the present invention is not limited thereto. Even if the first and second leads 31 and 32 are located in a direction away from the boundary line D-D, insofar as the dimension of the semiconductor device 1 in a direction orthogonal to the boundary line D-D does not increase, downsizing as a whole can be achieved.

Further, a protruding portion 121 is included in part of the second base plate 12, and the second base plate 12 is joined to the first lead 31 via the solder 63 at this protruding portion 121. Similarly, the protruding portion 131 is included in the current path member 13, and the protruding portion 131 and the second lead 32 are joined to each other via the solder 66. This can secure the application height of the solder 63 and 66, and thus, not only the workability of applying the solder is improved, but also the amount of the applied solder can be increased to improve the reliability of the solder joining. This can inhibit heat generation at the solder joining portions, and thus, deformation can be inhibited, and the reliability and the life of the entire semiconductor device 1 are improved. Note that, even if the above-mentioned joining is carried out by, for example, welding, insofar as the protruding portions 121 and 131 are included, the contact pressure at the welded surface can be increased, and, as a result, the reliability of the semiconductor device 1 can be improved.

In this first embodiment, a case in which the second base plate 12 and the current path member 13 are provided with the protruding portions 121 and 131, respectively, is described, but the present invention is not limited thereto. The protruding portion may be provided in only any one of the second base plate 12 and the current path member 13 or the protruding portion may be provided in the first lead 31 or the second lead 32 to obtain similar effects.

Second Embodiment

Figure 5:
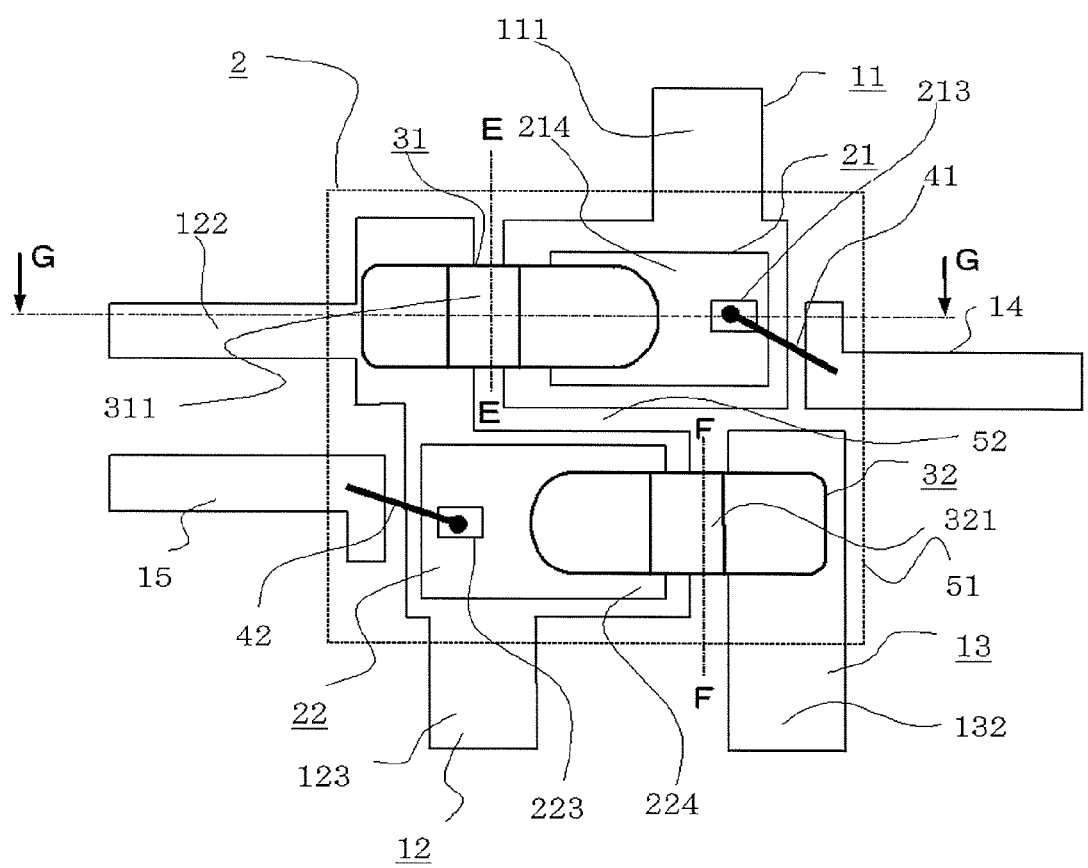
FIG. 5 A plan view illustrating a semiconductor device according to a second embodiment of the present invention.
Figure 6:
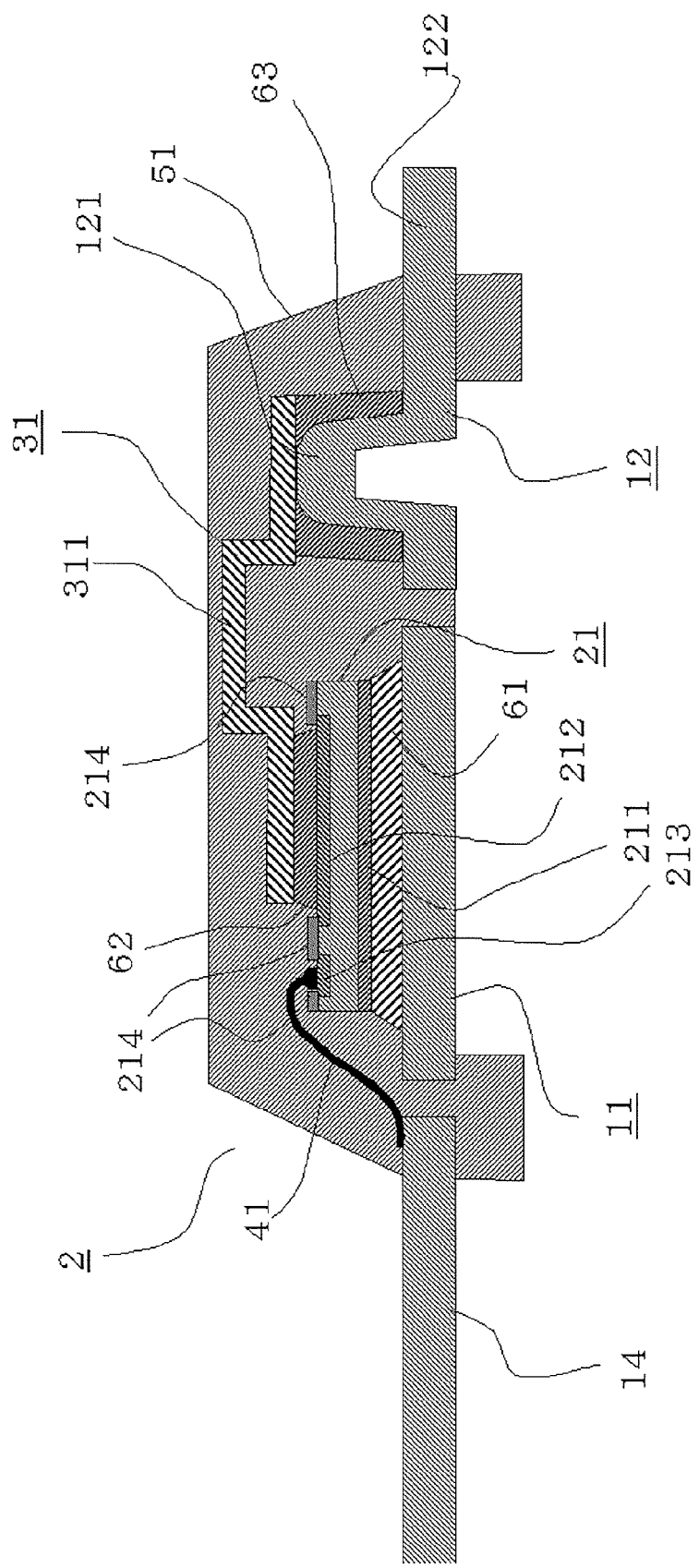
FIG. 6 A sectional view of the semiconductor device seen from a direction of arrows G-G of FIG. 5.
Figure 7:
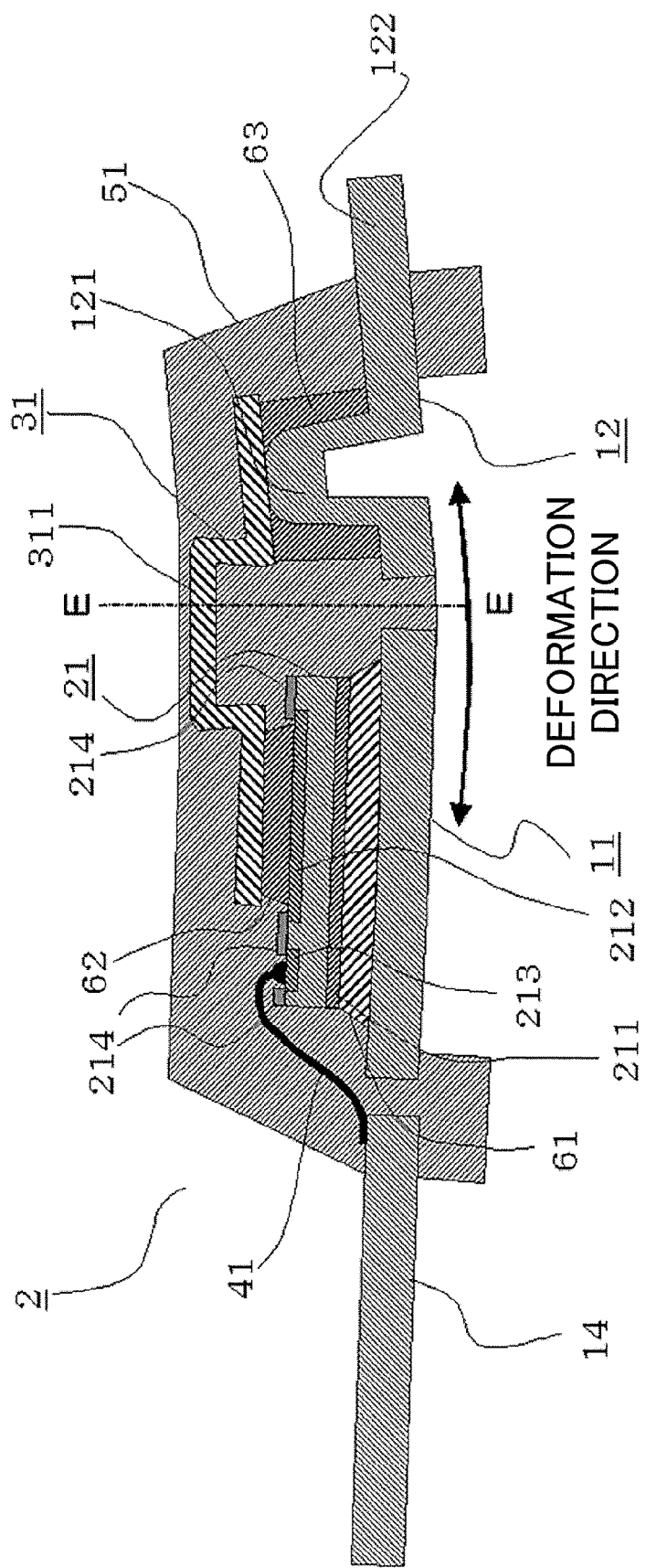
FIG. 7 A sectional view of the semiconductor device when deformed seen from the direction of the arrows G-G of FIG. 5.

FIG. 5 is a plan view illustrating a semiconductor device according to a second embodiment of the present invention. FIG. 6 is a sectional view of the semiconductor device seen from a direction of arrows G-G of FIG. 5. FIG. 7 is a sectional view of the semiconductor device when deformed seen from the direction of the arrows G-G of FIG. 5. FIG. 8 is an electrical circuit diagram of the semiconductor device illustrated in FIG. 5. The structure of a semiconductor device 2 in the second embodiment is the same as the structure in the first embodiment except for the first and second leads 31 and 32, and thus, detailed description thereof is omitted.

As illustrated in FIG. 5 and FIG. 6, the first lead 31 extends from above the first MOS-FET 21 toward the protruding portion 121 of the second base plate 12. A bent portion 311 as a stress absorbing portion is provided in a portion between the first MOS-FET 21 and the protruding portion 121 of the second base plate 12. The bent portion 311 is bent upward of the semiconductor device 2 so as to be away from the first and second base plates 11 and 12. In this case, as illustrated in FIG. 6, a line which is between solder joined areas in the first lead 31 and which extends in a direction intersecting the first lead 31 is defined as a boundary line E-E.

The boundary line E-E is away from the second MOS-FET 22 which generates heat during the operation of the semiconductor device 2. Therefore, it is thought that the semiconductor device 2 may be deformed so as to be V-shaped with the boundary line E-E being the bent line, although the deformation is smaller than the deformation with the boundary line D-D being the bent line.

In this case, as illustrated in FIG. 7, with the structure as in this second embodiment, even if the semiconductor device 2 is deformed with the boundary line E-E being the bent line, the bent portion 311 absorbs the stress, and thus, stress applied to the solder portion which joins the first lead 31 to the first MOS-FET 21 or to the solder portion which joins the first lead 31 to the second base plate 12 can be alleviated. Therefore, occurrence of a crack in the solder at the solder portion can also be inhibited without enhancing the rigidity of the second base plate 12, and thus, the reliability and the life of the semiconductor device 2 can be further improved.

Note that, even if the bent portion 311 provided in the first lead 31 is bent in a direction in proximity to the first base plate 11 and the second base plate 12, similar effects are obtained. Alternatively, the present invention is not limited to the bent portion 311, and similar effects are obtained by setting the rigidity to be lower than those in other portions of the first lead 31 through, for example, reducing the thickness by presswork or the like or providing a narrow portion by a through hole, a recess, a notch, or the like.

Further, when, in addition to the above description, a bent portion 321 or the like is provided at a similar location in the second lead 32, similar effects are obtained with regard to deformation with a boundary line F-F which intersects the second lead 32 being the bent line.

In this second embodiment, the description is made in the context that the two semiconductor elements are MOS-FETs, but the present invention is not limited thereto. The two semiconductor elements may be, for example, IGBTs or other semiconductor elements. However, a MOS-FET generates a large amount of heat during the operation and the entire semiconductor device deforms greatly, and thus, when the present invention is applied to the semiconductor device including MOS-FETs, the effect of improving the reliability and the life of the semiconductor device become greater.

Third Embodiment

Figure 9:
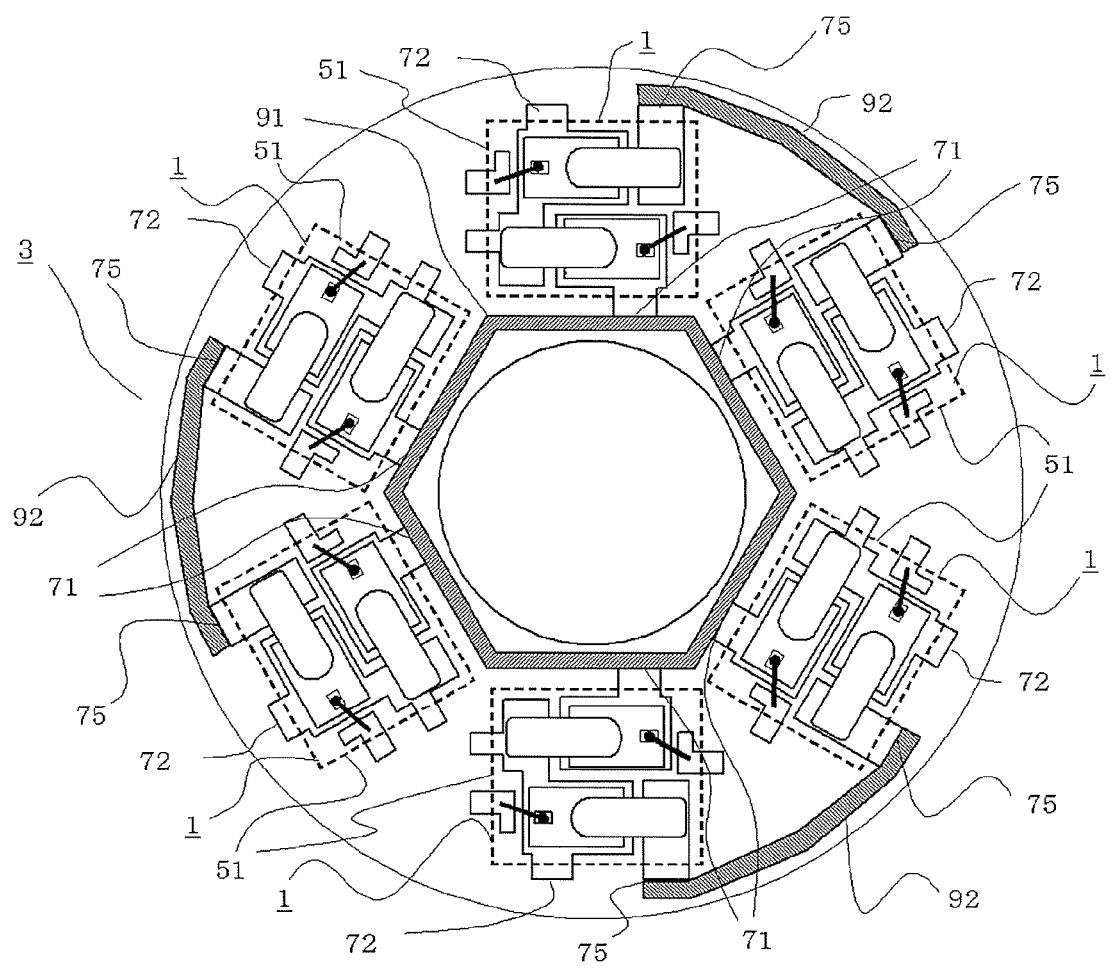
FIG. 9 A plan view illustrating an inverter device according to a third embodiment of the present invention.
Figure 10:
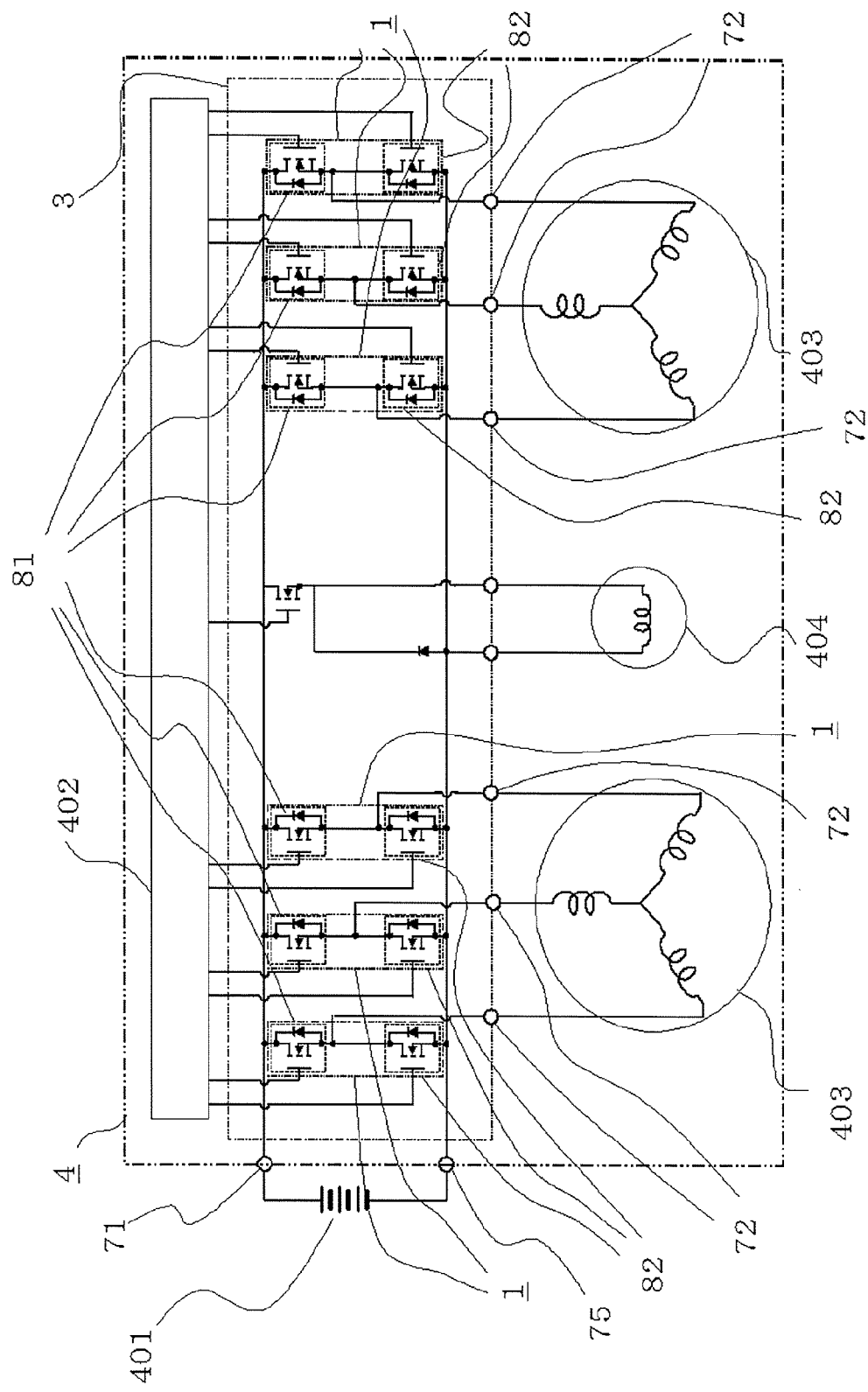
FIG. 10 An electrical circuit diagram of a rotating electrical machine including the inverter device according to the third embodiment of the present invention.

FIG. 9 is a plan view illustrating an inverter device which uses the semiconductor device according to the present invention. FIG. 10 is an electrical circuit diagram of a rotating electrical machine including the inverter device.

In FIG. 9, six semiconductor devices 1 form an inverter device 3 by being located on concentric circles. The positive electrode terminal 71 and the negative electrode terminal 75 of the semiconductor device 1 are located on opposed sides of the quadrangular package formed by the sealing resin 51.

Further, half of the semiconductor devices 1 are configured to have a plane symmetric structure with planes perpendicular to the plane on which the concentric circles are formed being the planes of symmetry, and are alternately located in a radial direction.

In this case, the positive electrode terminals 71 of the semiconductor devices 1 are located in the shape of a regular hexagon on an inner side of the semiconductor devices 1 (on the side of the center of the concentric circles), and are electrically joined to a positive voltage supply member 91 for supplying electric power. The positive voltage supply member 91 is electrically joined to a positive electrode (not shown) of electricity storage means 401 via wiring (not shown). Similarly, the negative electrode terminals 75 of the semiconductor devices 1 are located on an outer side of the semiconductor devices 1 (on the side opposite to the center of the concentric circles), and are electrically joined to a negative voltage supply member 92 for supplying electric power. The negative voltage supply member 92 is electrically joined to a negative electrode (not shown) of the electricity storage means 401 via wiring (not shown). Electrical joining at these locations is carried out by, for example, welding or soldering. Further, the output terminals 72 of phases formed by the semiconductor devices 1 are connected via wiring (not shown) to coils of a rotating electrical machine 4 to be described below.

Next, the rotating electrical machine 4 using the inverter device 3 is described. As illustrated in FIG. 10, the rotating electrical machine 4 includes control means 402, the inverter device 3, fixed coils 403, and a movable coil 404, and serves both as a motor and as a generator. Specifically, the rotating electrical machine 4 has the control means 402 and the inverter device 3 integrally mounted thereto. The phases of the two fixed coils 403 are electrically joined to the electricity storage means 401 via the output terminals 72 of the semiconductor devices 1, respectively. By sending a gate signal from the control means 402 to the MOS-FETs 21 and 22 of the respective semiconductor devices 1, the respective MOS-FETs 21 and 22 are turned ON/OFF to switch current flowing through the respective phases of the fixed coils 403. The rotating electrical machine 4 can drive the movable coil 404 in response to a signal from the control means 402 and can generate electric power by rotation of the movable coil 404.

As described above, the semiconductor device 1 can inhibit a crack in the solder and improves the reliability and the life, and thus, by applying the semiconductor device 1 to the inverter device 3, the reliability and the life of not only the inverter device 3 but also the rotating electrical machine 4 using the inverter device 3 are improved. In particular, when they are for a vehicle and these requirements are strict, the application of the semiconductor device 1 to the inverter device 3 is effective. In addition, when, in the semiconductor device 1, the gap portion along which the first and second MOS-FETs 21 and 22 are opposed to and adjacent to each other can be narrowed compared with that in a conventional structure as described above, by locating the semiconductor devices 1 in the inverter device 3 as illustrated in FIG. 9, the radial length of the concentric circles can be reduced, which enables the positive and negative voltage supply components 91 and 92 to be located in extra space inside and outside the semiconductor devices 1, respectively. Conventionally, when only space inside or outside of the concentric circles of the semiconductor devices 1 can be secured, the semiconductor devices 1 and the positive and negative voltage supply components 91 and 92 are located in a layer which is above and in parallel with a plane in which the concentric circles having the semiconductor devices 1 located thereon are formed, and this structure is laminated, and thus, the size of the inverter device 3 increases. There is a possibility that the structure according to the present invention enables the semiconductor devices 1, the positive voltage supply member 91, and the negative voltage supply member 92 to be located in one plane, and the thickness of the inverter device 3 to be reduced to downsize the inverter device 3.

Further, in this third embodiment, the plurality of positive electrode terminals 71 of the semiconductor devices 1 and the single positive voltage supply member 91 are electrically joined to each other, and the positive voltage supply member 91 is electrically joined via wiring to the positive electrode of the electricity storage means 401. Therefore, it is not necessary to join via separate wiring the positive electrode terminals 71 and the positive electrode of the electricity storage means 401, and, it is only necessary to connect via single wiring the positive voltage supply member 91 electrically joined to the positive electrode terminals 71 and the positive electrode of the electricity storage means 401, and thus, the wiring can be compact and the reliability and the life of the connecting portions are improved. As a result, the inverter device 3 can be downsized, and the cost thereof can be reduced.

Further, part of the semiconductor devices 1 which form the inverter device 3, that is, half of the semiconductor devices 1 have a plane symmetric structure with the other semiconductor devices 1, with the planes perpendicular to the plane on which the concentric circles are formed being the planes of symmetry, and are alternately located in the radial direction of the concentric circles. When the negative electrode terminal 75 of the semiconductor device 1 does not exist on a line connecting the center of the concentric circles and the center of the semiconductor device 1 but is off-center, by locating the semiconductor devices 1 alternately as described above, the relative distance between the negative electrode terminals 75 of adjacent semiconductor devices 1 becomes smaller and wiring for connecting the negative electrode terminal 75 to the negative voltage supply member 92 can be compact, and thus, the reliability and life of the connecting portions are improved. As a result, the inverter device 3 can be downsized and the cost thereof can be reduced.

Further, the semiconductor device and the inverter device according to the present invention have the above-mentioned effects that downsizing can be achieved and the cost can be reduced, and thus, similar effects can be obtained with regard to the rotating electrical machine 4 which serves both as a motor and as a generator and includes the semiconductor device and the inverter device integrally mounted thereto. In particular, a rotating electrical machine for a vehicle is strictly required to be downsized and the like, and thus, the present invention is more effective.

In addition, in this third embodiment, the number of the semiconductor devices 1 is six (six phases), but the present invention is not limited thereto. Further, the shape of the positive voltage supply member 91 is not limited to a hexagon, and may be a polygon or a circle.

Further, in this third embodiment, the positive voltage supply member 91 is located inside the semiconductor devices 1, but the negative voltage supply member 92 may be located inside. This case is achieved by changing the circuit structure by exchanging the locations of the positive electrode terminals 71 and the negative electrode terminals 75 of the semiconductor devices 1 so that the negative electrode terminals 75 of the semiconductor devices 1 are located inside.

Fourth Embodiment

Figure 11:
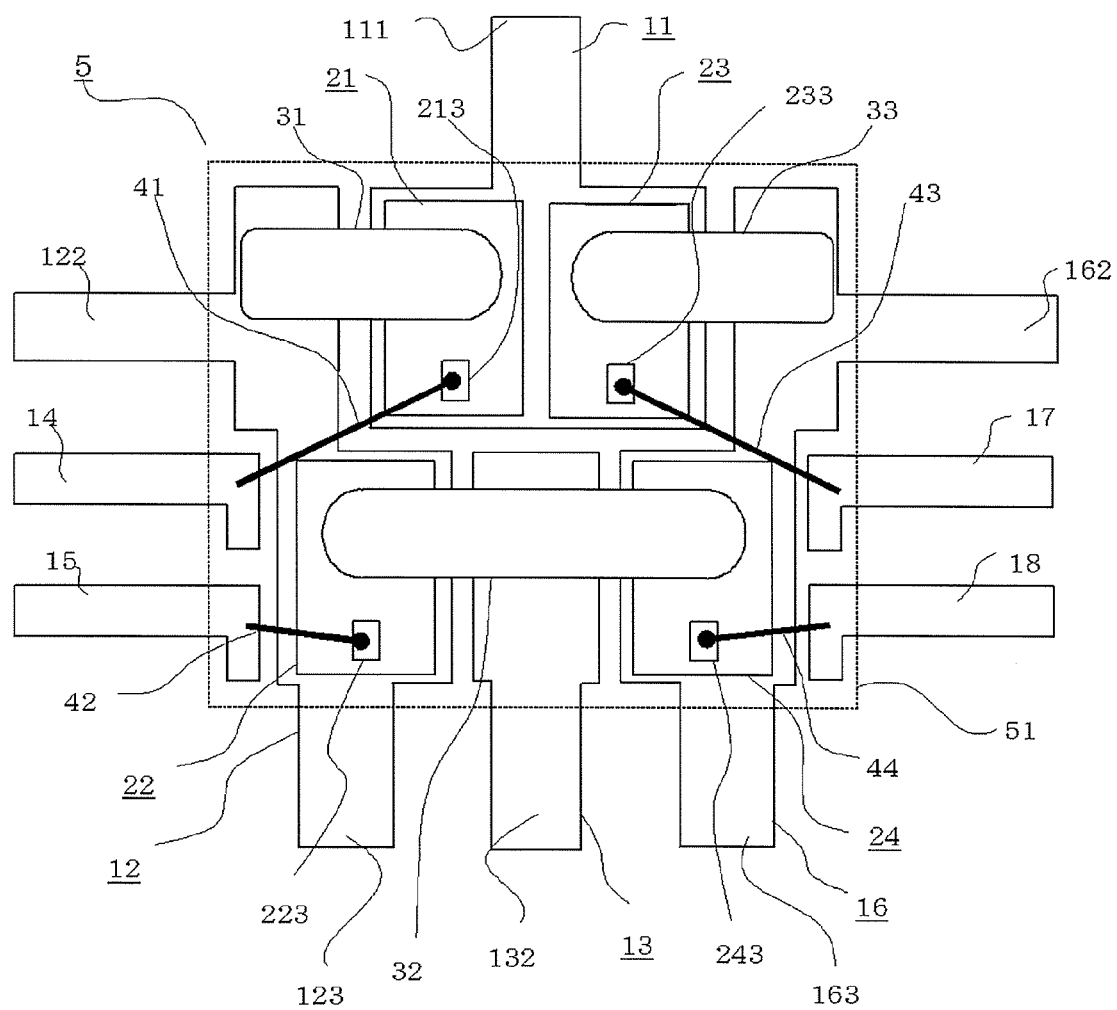
FIG. 11 A plan view illustrating a semiconductor device according to a fourth embodiment of the present invention.
Figure 12:
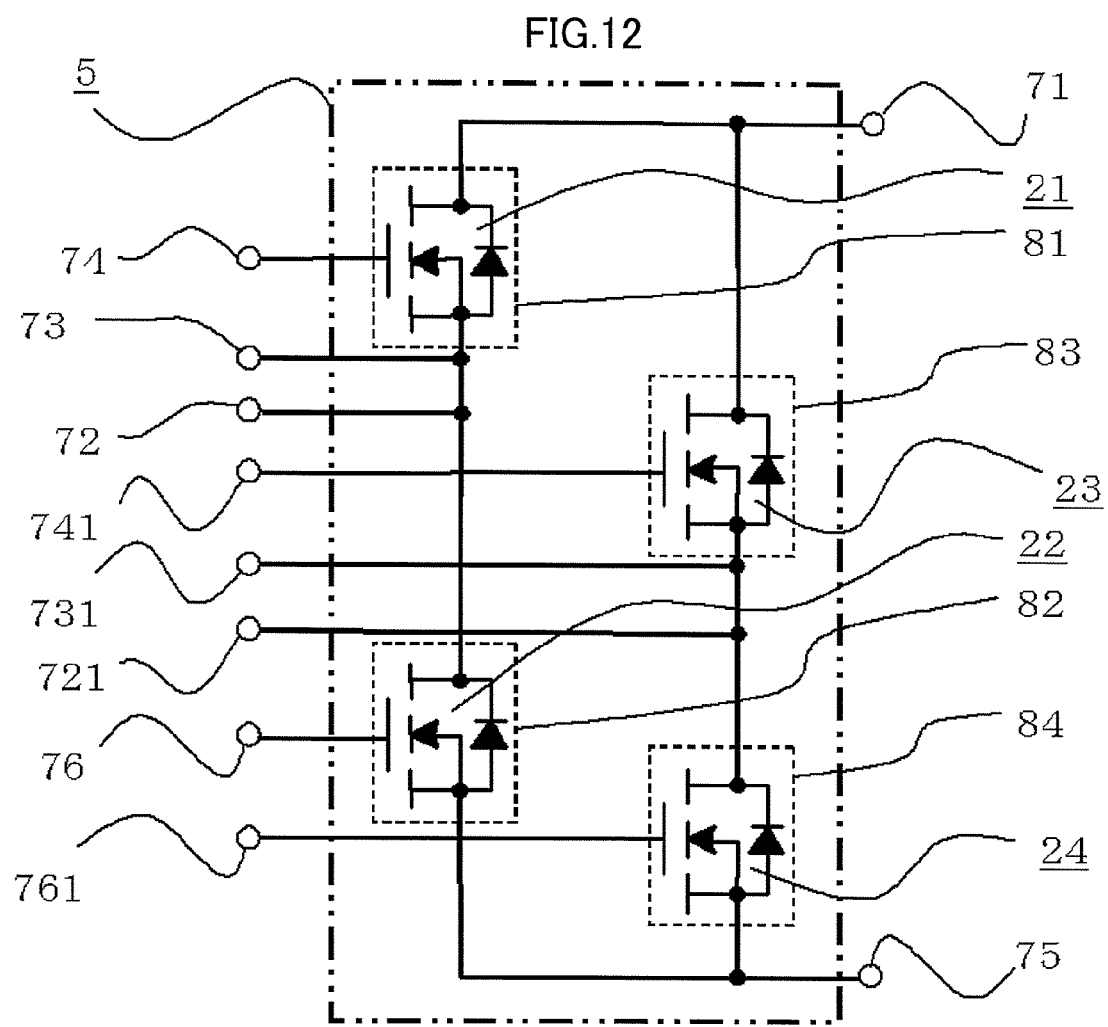
FIG. 12 An electrical circuit diagram of the semiconductor device according to the fourth embodiment of the present invention.

FIG. 11 is a plan view illustrating a semiconductor device according to a fourth embodiment of the present invention. FIG. 12 is an electrical circuit diagram of the semiconductor device illustrated in FIG. 11. The semiconductor device 1 described in the first embodiment has the pair of upper and lower arms 81 and 82 and each arm has one of the MOS-FETs 21 and 22, but the semiconductor device according to the present invention is not limited thereto, and two or more pairs of upper and lower arms may be incorporated in one semiconductor device. In this fourth embodiment, a schematic structure for a semiconductor device 5 that includes two pairs of upper and lower arms 81 to 84 is described as illustrated in FIG. 11 and FIG. 12.

Specifically, in addition to the first MOS-FET 21, a drain electrode (not shown) of a third MOS-FET 23 is electrically joined to the first base plate 11. A source electrode (not shown) of the third MOS-FET 23 is electrically joined to a third base plate 16 via a third lead 33. A drain electrode (not shown) of a fourth MOS-FET 24 is electrically joined to the third base plate 16, and a source electrode (not shown) of the fourth MOS-FET 24 is electrically joined to the current path member 13 via the second lead 32. Further, gate electrodes 233 and 243 of the third and fourth MOS-FETs 23 and 24 are electrically joined to leads 17 and 18 for the gate electrodes via aluminum wires 43 and 44, thereby being connected to control terminals 741 and 761 (not shown) for inputting a gate signal, respectively. The third base plate 16 includes a control terminal joining portion 162 for outputting a signal from the source electrode of the fourth MOS-FET 24 and an output terminal joining portion 163 to be electrically joined to an output terminal 721 (not shown). The control terminal joining portion 162 is electrically joined to a control terminal 731 (not shown). The sealing resin 51 seals these first to fourth MOS-FETs 21 to 24, first to third base plates 11, 12, and 16, current path member 13, first to third leads 31 to 33, aluminum wires 41 to 44, and leads 14, 15, 17, and 18 for the gate electrodes and forms a quadrangular package seen from above as illustrated in FIG. 11.

When the semiconductor device is formed in this way, as illustrated in FIG. 11, the positive electrode terminal joining portion 111 of the first base plate 11 and the negative electrode terminal joining portion 132 of the third base plate 13 which are electrically joined to the positive electrode terminal 71 (not shown) and the negative electrode terminal 75 (not shown), respectively, can be shared by the upper and lower arms 81 to 84 located on the right side and on the left side of FIG. 11. Therefore, not only the cost and the weight can be reduced by reducing the number of the components but also the space efficiency is improved, and thus, a further highly integrated semiconductor device can be realized.

Further, in these first to fourth embodiments, as illustrated in FIGS. 2 to 5, the lower surface side of the first base plate 11 at the location to which the first MOS-FET 21 is joined, the lower surface side of the second base plate 12 at the location to which the second MOS-FET 22 is joined, and the like are exposed from the sealing resin 51 in order to form the heat dissipating surfaces. However, the present invention is not limited thereto, and these portions may be covered, for example, with the sealing resin 51, or with a thermally conductive insulating member (not shown). Further, the joining materials 61 to 66 may be a conductive adhesive, but it is desired to use a mechanically strong material.

Further, the sealing resin 51 may be, other than an epoxy resin, ceramic, glass, or the like which makes hermetic sealing.

REFERENCE SIGNS LIST 1, 2 semiconductor device
3 inverter device
4 rotating electrical machine
11 first base plate
12 second base plate
121 protruding portion
13 current path member
131 protruding portion
21 first MOS-FET
211 drain electrode
212 source electrode
22 second MOS-FET
221 drain electrode
222 source electrode
31 first lead
311 bent portion
32 second lead
321 bent portion
51 sealing resin
52 gap portion
61 to 66 solder
91 positive voltage supply member
92 negative voltage supply member

The invention claimed is:

1. A semiconductor device, comprising:
a first base plate comprising a conductor;
a first semiconductor element having a first electrode surface that is electrically joined onto the first base plate via a joining material;
a second base plate comprising a conductor, the second base plate being away from the first base plate;
a second semiconductor element that is adjacent to the first semiconductor element and has a first electrode surface that is electrically joined onto the second base plate via a joining material;
a first lead for electrically joining a second electrode surface of the first semiconductor element and the second base plate via a joining material;
a current path member for sending and receiving current flowing through both the first semiconductor element and the second semiconductor element to and from outside, the current path member being away from both the first base plate and the second base plate;
a second lead for electrically joining a second electrode surface of the second semiconductor element and the current path member via a joining material; and
a sealing material for sealing at least the respective structural members, wherein:
a rigidity of the second base plate is higher than each of a rigidity of the first lead and a rigidity of the second lead;
a boundary line including a gap portion along which the first semiconductor element and the second semiconductor element are opposed to each other and extending in a direction in which both the first semiconductor element and the second semiconductor element are not opposed to each other intersects the second base plate without intersecting the first lead and the second lead; and
the first lead extends from a joining portion with the first semiconductor element in a first direction, and the second lead extends from a joining portion with the second semiconductor element in a second direction, which is opposite to the first direction.

2. A semiconductor device according to claim 1, wherein the second base plate intersects a portion of the boundary line at a location other than the gap portion.

3. A semiconductor device according to claim 1, wherein a rigidity of a portion of the second base, which intersects the boundary line, is lower than rigidities of other portions in the second base plate.

4. A semiconductor device according to claim 1, wherein a portion of the second base plate, which intersects the boundary line, comprises a bent portion for absorbing stress.

5. A semiconductor device according to claim 1, wherein:
the first semiconductor element and the second semiconductor element are located so as to be point symmetric with respect to the gap portion; and
the first lead and the second lead are aligned with the boundary line such that the first lead is disposed in parallel with the second lead.

6. A semiconductor device according to claim 1, wherein at least any one of a joining portion of the second base plate with the first lead and a joining portion of the current path member with the second lead comprises a protruding portion.

7. A semiconductor device according to claim 1, wherein a rigidity of a portion formed between both the joining portions in the first lead or the second lead is lower than rigidities of other portions in the first lead or the second lead.

8. A semiconductor device according to claim 1, wherein a portion formed between both the joining portions in the first lead or the second lead comprises a bent portion for absorbing stress.

9. A semiconductor device according to claim 1, wherein the first semiconductor element and the second semiconductor element are MOS-FETs.

10. An inverter device, comprising the semiconductor device according to claim 1.

11. An inverter device according to claim 10, further comprising:
a plurality of the semiconductor devices located on one plane and on concentric circles;
part of one of each of the first base plates and each of the current path members exposed from the sealing material, the part extending toward an inside of the concentric circles with respect to the plurality of the semiconductor devices; and
one electric power supply member that is provided on the plane so as to be opposed to the part of the one of each of the first base plates and each of the current path members which are exposed, connected to one electrode of a direct current power supply, and also electrically joined to the part of the one of each of the first base plates and each of the current path members which are exposed in two or more of the plurality of the semiconductor devices.

12. An inverter device comprising:
a semiconductor device, comprising:
a first base plate comprising a conductor;
a first semiconductor element having a first electrode surface that is electrically joined onto the first base plate via a joining material;
a second base plate comprising a conductor, the second base plate being away from the first base plate;
a second semiconductor element that is adjacent to the first semiconductor element and has a first electrode surface that is electrically joined onto the second base plate via a joining material;
a first lead for electrically joining a second electrode surface of the first semiconductor element and the second base plate via a joining material;
a current path member for sending and receiving current flowing through both the first semiconductor element and the second semiconductor element to and from outside, the current path member being away from both the first base plate and the second base plate;
a second lead for electrically joining a second electrode surface of the second semiconductor element and the current path member via a joining material;
a sealing material for sealing at least the respective structural members,
wherein a rigidity of the second base plate is higher than each of a rigidity of the first lead and a rigidity of the second lead; and
wherein a boundary line including a gap portion along which the first semiconductor element and the second semiconductor element are opposed to each other and extending in a direction in which both the first semiconductor element and the second semiconductor element are not opposed to each other intersects the second base plate without intersecting the first lead and the second lead;
a pair of the semiconductor devices having a plane symmetric structure with a plane perpendicular to the plane being a plane of symmetry, the pair of the semiconductor devices being located so as to be adjacent to each other; and another electric power supply member that is provided on the plane and outside the concentric circles with respect to the plurality of the semiconductor devices, connected to another electrode of the direct current power supply, and also electrically joined to part of another of the one of each of the first base plates and each of the current path members which are exposed, wherein joining portions at which the part of the another of the one of each of the first base plates and each of the current path members which are exposed are electrically joined to the another electric power supply member are located off lines connecting a center of the concentric circles and centers of the plurality of the semiconductor devices, respectively.

13. A rotating electrical machine for a vehicle comprising the inverter device according to claim 10.

14. A semiconductor device according to claim 1, further comprising:
- a third lead for electrically connecting with a third electrode of the first semiconductor element;
- a fourth lead for electrically connecting with a third electrode of the second semiconductor element,
- wherein the third lead is disposed on a first lateral side of the first semiconductor element, and the fourth lead is disposed on a second lateral side of the second semiconductor element, which is opposite to the first lateral side.

* * * * *